(12) United States Patent
Chen

(10) Patent No.: US 10,069,574 B2
(45) Date of Patent: Sep. 4, 2018

(54) OPTOCOUPLER WITH INDICATION OF LIGHT SOURCE POWER SUPPLY FAILURE

(71) Applicant: Avago Technologies General IP (Singapore) Pte. Ltd., Singapore (SG)

(72) Inventor: HongLei Chen, Singapore (SG)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 306 days.

(21) Appl. No.: 14/872,344

(22) Filed: Oct. 1, 2015

(65) Prior Publication Data

US 2017/0098635 A1    Apr. 6, 2017

(51) Int. Cl.
*H04B 10/80* (2013.01)
*H01L 25/16* (2006.01)

(52) U.S. Cl.
CPC ......... *H04B 10/802* (2013.01); *H01L 25/167* (2013.01); *H01L 2224/48091* (2013.01); *H01L 2224/48247* (2013.01); *H01L 2924/181* (2013.01)

(58) Field of Classification Search
CPC ............... H04B 10/802; H01L 25/167; H01L 2224/48091; H01L 2224/48247; H01L 2924/181; H01L 2924/00014; H01L 2924/00012
See application file for complete search history.

(56) References Cited

U.S. PATENT DOCUMENTS

| | | | | |
|---|---|---|---|---|
| 3,772,514 A | * | 11/1973 | Sunderland | G01R 15/22 250/551 |
| 5,444,590 A | * | 8/1995 | LeComte | H02H 3/093 361/103 |
| 7,113,708 B1 | * | 9/2006 | Creaney | H04B 10/07955 398/140 |
| 8,116,055 B2 | | 2/2012 | Baumgartner et al. | |
| 2002/0044463 A1 | * | 4/2002 | Bontempo | H02M 3/28 363/21.07 |
| 2006/0221650 A1 | * | 10/2006 | Yamada | H02M 1/36 363/21.01 |
| 2012/0068614 A1 | | 3/2012 | Ng et al. | |

FOREIGN PATENT DOCUMENTS

CN      101743674 B      12/2013

* cited by examiner

*Primary Examiner* — Que T Le
*Assistant Examiner* — Jennifer Bennett
(74) *Attorney, Agent, or Firm* — Sheridan Ross P.C.

(57) ABSTRACT

An optical system, an optocoupler, and an isolation device are provided. The disclosed optical system includes at least one photodetector that receives light energy and converts the light energy into one or more electrical signals. The disclosed optical system further includes a comparator module that receives the one or more electrical signals from the at least one photodetector and compares the one or more electrical signals against two different reference values to determine whether a power supply fault condition has occurred for a light source that emitted the light energy and to determine a logic signal conveyed to the at least one photodetector via the light energy emitted by the light source.

20 Claims, 7 Drawing Sheets

OPTOCOUPLER WITH INDICATION OF LIGHT SOURCE POWER SUPPLY FAILURE

FIELD OF THE DISCLOSURE

The present disclosure is generally directed toward optoelectronic devices and, in particular, optocoupling devices.

BACKGROUND

In electronics, an optocoupler, also referred to as an opto-isolator, photocoupler, or optical isolator, is an optoelectronic device designed to transfer electrical signals by utilizing light waves to provide coupling with electrical isolation between its input and output. One goal of an optocoupler is to prevent high voltages or rapidly changing voltages on one side of the circuit from damaging components or distorting transmissions on the other side.

A typical optocoupler includes a light source, such as a Light Emitting Diode (LED), a photodetector, and an insulation medium. As the name suggests, an optical path needs to be created between the LED and photodetector via the insulation medium. This is traditionally done by using an optically-transparent material such as silicone to create the light path. The insulation medium not only acts to allow the transmission of light from the LED to the photodetector, but the insulation medium also electrically insulates the input and output sides of the circuit.

BRIEF DESCRIPTION OF THE DRAWINGS

The present disclosure is described in conjunction with the appended figures, which are not necessarily drawn to scale.

DETAILED DESCRIPTION

Figure 1:
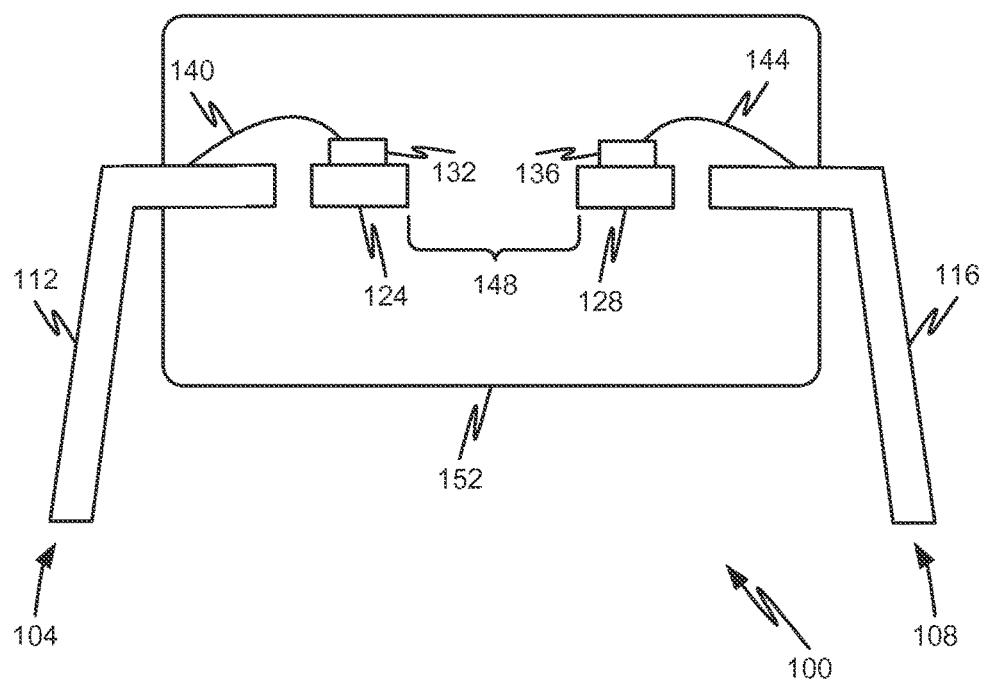
FIG. 1 is a cross-sectional view of an optocoupler device in accordance with embodiments of the present disclosure.

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

A conventional optocoupler device has a limitation that in the event of a power supply failure to the light source's driver, the light source will be OFF, the photodetector will provide no current output, and it is difficult or impossible to tell whether the light source is simply OFF due to its normal operation or the light source is OFF due to a loss of power to the light source's driver. In other words, because the output side of the optocoupler is physically isolated from the input side of the optocoupler, it is difficult or impossible for the output side to differentiate between a logical low input signal and a failure condition.

It is, therefore, one aspect of the present disclosure to provide an optocoupler that addresses the needs and shortcomings of prior art optocouplers. In particular, an optocoupler is provided with the ability to detect power failure conditions for a light source in addition to also detecting logical high and low signals transmitted by an input side of the optocoupler. In some embodiments, a secondary current source in the driving circuit of the light source is utilized. The secondary current source drives or controls the light source in addition to the primary current source, which is controlled by an input signal or its modulated format (e.g., sigma-delta modulated signal). Both current sources take power from the input side power supply source and are combined to drive the light source.

On the receiver side of the optocoupler, the receiver circuit may include a photodetector diode, a transimpedance amplifier (TIA), and a comparator module having a logic circuit. In some embodiments, a two-threshold comparison circuit is used in this stage: a first threshold for the light source resulting from the secondary current source, and a second threshold for the light resulting from the signal-controlled light source. As long as the photodetector current is above the first threshold, the light source power supply and its driver circuit are determined to be in proper operational condition. If the photodetector current falls below the first threshold, then the receiver circuit is capable of determining that a fault condition has occurred with respect to the light source, its secondary current source, or some other aspect of the driver circuit for the light source.

Embodiments of the present disclosure utilize an extra current source to drive the light source thereby producing light as a power supply indicator. This utilization of an extra current source enables the receiver/detector side of the optocoupler to determine normal/abnormal power supply conditions as well as determine normal signal processing.

As can be seen in FIGS. 1-8, various configurations of optoelectronic devices, optocouplers, isolation devices, and intermediate optocoupler configurations are depicted and described. Although some of the optocouplers depicted in the figures correspond to optocouplers at intermediate stages of manufacturing, one of ordinary skill in the art will appreciate that any of the intermediate products described herein can be considered an optocoupler. In other words, one or more of the optoelectronic devices may be employed as optocouplers or as components within a coupling system. In some embodiments, the optocoupler devices described herein may be incorporated into any system which requires current and/or voltage monitoring, but is susceptible to transients. In some embodiments, the coupling system in which the optocoupler devices described herein is rated to operate at about hundreds or thousands of Volts. Stated another way, the input side (e.g., a high-voltage side) of the optocoupler device may be directly connected to a voltage source of hundreds or thousands of Volts without damaging the optocoupler device or any electronic devices attached to the output side (e.g., a low-voltage side) of the optocoupler device. Accordingly, the coupling system which employs the optocoupler devices disclosed herein may be configured to operate in high-voltage or high-current systems but may also be configured to separate the high-voltage or high-current systems from a low-voltage or low-current system.

Figure 2:
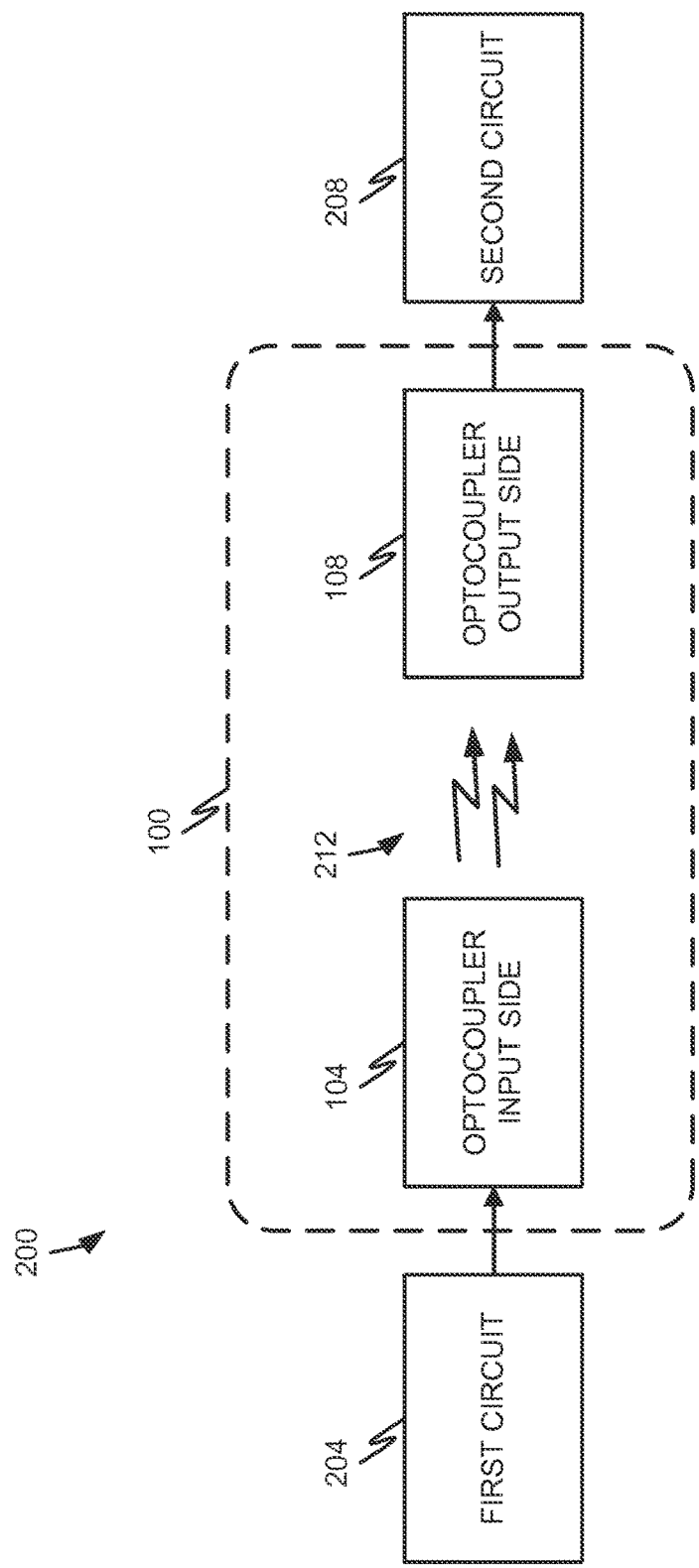
FIG. 2 is a block diagram depicting an optical system in accordance with at least some embodiments of the present disclosure.

Referring initially to FIGS. 1 and 2, an optocoupler 100 and an optical system 200 including an optocoupler 100 will be described in accordance with at least some embodiments of the present disclosure. The optocoupler 100 may comprise an input side 104 and an output side 108 that are separated by an isolation gap 148. The isolation gap 148 may correspond to the shortest linear distance between electrically conductive components of the input side 104 and the output side 108.

The input side 104 may be configured for connection to a first circuit 204 whose current and/or voltage is being measured and the output side 108 may be configured for connection to measurement and/or control circuitry via a second circuit 208. The isolation gap 148 is provided to electrically insulate the currents/voltages of the first circuit 204 from the second circuit 208. In some embodiments, because the circuits 204, 208 are electrically isolated from one another, the circuits 204, 208 may utilize different ground or reference voltages.

The input side 104 and output side 108 may each comprise one or more electrically conductive leads 112, 116. The cross-sectional view of FIG. 1 shows a single lead 112 on the input side 104 and a single lead 116 on the output side 108, but those of ordinary skill will appreciate that both sides of the optocoupler 100 may have more than one lead. In some embodiments, the leads 112, 116 of the input side 104 and output side 108 may be initially provided as a sheet of conductive material having portions removed therefrom to establish discrete conductive elements or features. The conductive elements of the leadframe including the leads of the input side 104 and output side 108 may be constructed of metal (e.g., copper, silver, gold, aluminum, steel, lead, etc.), graphite, and/or conductive polymers.

The lead 112 of the input side 104 comprises a first end and second end with a bend or fold therebetween. The first end of the input lead 112 may be configured to interface with the first circuit 204. The second end of the input lead 112 may terminate inside a mold material 152 that encapsulates and protects the optical components of the optocoupler 100. The bend between the first end of the input lead 112 and the second end of the input lead 112 may occur outside the mold material 152 thereby enabling the optocoupler 100 to be mounted on a PCB or inserted into thru holes of a PCB.

Similar to the input side 104, the lead 116 of the output side 108 comprises a first end and second end with a bend or fold therebetween. The first end of the output lead 116 may be configured to interface with external circuitry, such as the second circuit 208. The second end of the output lead 116 may terminate inside the mold material 152. The bend between the first end of the output lead 116 and the second end of the output lead 116 may be symmetrical to the bend on the input side 104.

In some embodiments, the bends and the length of the leads 112, 116 extending beyond the mold material 152 may be adjusted to suit the particular type of device to which the optocoupler 100 will be connected. In other words, although embodiments of the present disclosure show the leads as having a specific configuration (e.g., thru-hole configurations), it should be appreciated that the leads or relevant sections protruding from the mold material 152 may comprise any type of known, standardized, or yet-to-be developed configuration such as straight-cut leads, J leads, SOJ leads, gullwing, reverse gullwing, etc.

In some embodiments, the optical components 132, 136 of the optocoupler 100 may be mounted directly on the leads, which extend out of the mold material 152. In some embodiments, a first mounting section 124 may be provided on a lead 112 of the input side 104. The first mounting section 124 may be part of a lead that extends outside the mold material 152 or it may be contained within the mold material 152. The first mounting section 124 may be configured to accommodate a light source 132. In some embodiments, the first mounting section 124 may be designated or designed to have the light source 132 mounted, welded, adhered, glued, fixed, or otherwise placed thereon. The first mounting section 124 does not necessarily have to be a part of the leadframe, but instead can be part of some other structure in the optocoupler. In the depicted embodiment, the first mounting section 124 is substantially co-planar with the second end of the input lead 112 and the second end of the output lead 116.

Similar to the input side 104, the output side 108 may also comprise a structure on which a light detector or photodetector 136 can be received. Specifically, a second mounting section 128 may be provided may be designated or designed to have the photodetector 136 mounted, welded, adhered, glued, fixed, or otherwise placed thereon. The second mounting section 128 does not necessarily have to be a part of the leadframe, but instead can be part of some other structure in the optocoupler. In the depicted embodiment, the second mounting section 128 is substantially co-planar with the first mounting section 124, the second end of the input lead 112, and the second end of the output lead 116. It is particularly efficient to build this type of optocoupler 100 with a leadframe that is initially provided in a sheet, since the sheet is initially flat and all of the leads and mounting sections are already in a common plane.

The light source 132 and photodetector 136 may be used to transmit signals across the isolation gap 148 in the form of optical signals 212. In some embodiments, the signals 212 transmitted across the isolation gap 148 may correspond to electrical signals that are converted into optical signals by the light source 132. The light source 132 emits light 212 toward the photodetector 136. The photodetector 136 then converts the optical signals back into electrical signals for transmission across one or more of the leads of the output side 108.

In some embodiments, the light source 132 may be a single light source or a plurality of light sources. Likewise, the photodetector 136 may be a single detector component or multiple detector components (e.g., a plurality of photodetectors).

In some embodiments, the light source 132 corresponds to a surface mount LED, a traditional LED (e.g., with pins for thru-hole mounting), an array of LEDs, a laser diode, or combinations thereof. The light source 132 is configured to convert electrical signals (e.g., current and/or voltage) from one or more leads of the input side 104 into light. The light 212 emitted by the light source 132 may be of any wavelength (e.g., either in or out of the visible light spectrum).

In some embodiments, the photodetector 136 corresponds to device or collection of devices configured to convert light or other electromagnetic energy into an electrical signal (e.g., current and/or voltage). Examples of a suitable photodetector 136 include, without limitation, a photodiode, a photoresistor, a photovoltaic cell, a phototransistor, an Integrated Circuit (IC) chip comprising one or more photodetector components, or combinations thereof. Similar to the light source 132, the photodetector 136 may be configured for surface mounting, thru-hole mounting, or the like.

In some embodiments, one surface of the light source 132 is an anode and another surface of the light source 132 is a cathode. One of the anode and cathode may be electrically connected to the first mounting section 124 and the other of the anode and cathode may be electrically connected to a different lead via a wire 140. By creating a potential between the anode and cathode of the light source 132, the light source 132 may be configured to emit light 212 of a predetermined wavelength. It should be appreciated that not every lead on the input side 104 needs to be connected either physically or electrically with the light source 132.

Like the light source 132, the light detector 136 may be mounted on the second mounting section 128 (e.g., corresponding to one of the leads of the output side 108) and may be electrically connected to another lead via a wire 144.

The mold material 152 may comprise non-conductive or insulative properties. Suitable types of materials that may be used as the mold material 152 include, without limitation, epoxy, silicone, a hybrid of silicone and epoxy, phosphor, a hybrid of phosphor and silicone, an amorphous polyamide resin or fluorocarbon, glass, any polymer or combination of polymers, any malleable or formable opaque material, or combinations thereof. The mold material 152 may be manufactured using extrusion, machining, micro-machining, molding, injection molding, or a combination of such manufacturing techniques.

Figure 3:
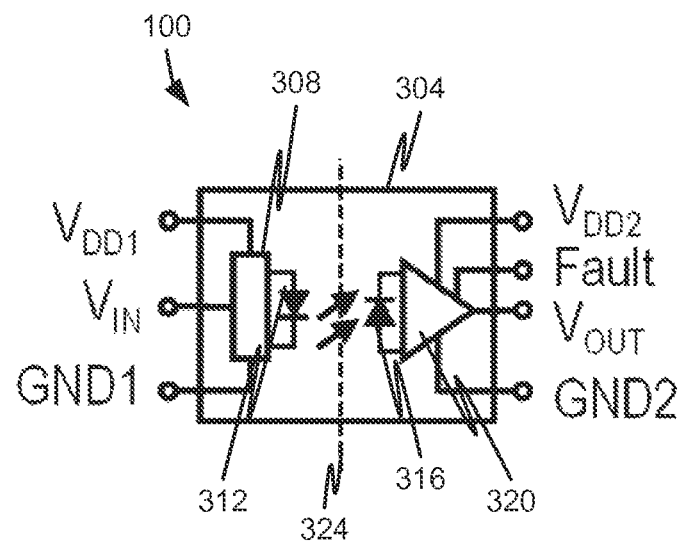
FIG. 3 is a circuit diagram depicting a components of an optocoupler device in accordance with at least some embodiments of the present disclosure.

With reference now to FIG. 3, additional details of the circuit components of an optocoupler 100 will be described in accordance with at least some embodiments of the present disclosure. The optocoupler 100 includes a housing 304 (e.g., an example of mold material 152) from which one or multiple leads extend. The leads on the input side of the optocoupler 100 may be connected to an input side power supply VDD1, a signal input VIN, and a first ground GND1. The leads on the output side of the optocoupler 100 may be connected to an output side power supply VDD2, a fault output FAULT, a signal output VOUT, and a second ground GND2.

The input side and output side may be electrically isolated from one another via the isolation barrier 324, which may be established with the isolation gap 148. Electrical components on the input side of the optocoupler include a light source, such as an LED 312 and driver circuitry 308. In some embodiments, the driver circuitry 308 receives the electrical power from the input side power supply VDD1 and signal input VIN and causes the LED 312 to emit light across the isolation barrier 324.

At the output side, a photodiode 316 receives the light emitted by the LED 312 and converts the light back into an electrical signal. The electrical signal may be provided to a comparator circuit 320 to determine: (1) whether the LED 312 is functional (e.g., receiving power) and (2) an output signal VOUT corresponding to a substantial match of the input signal VIN. As will be discussed in further detail herein, beside the normal signal transmission current source, the driver circuit 308 may comprise an additional bias current to minimally enable the LED 312 to constantly emit light even when a logical signal is received at the signal input VIN that would not normally cause the LED 312 to emit light. This enable the photodetector 316 and comparator circuit 320 to determine if a normal power supply is being provided to the LED 312 or not.

Figure 4:
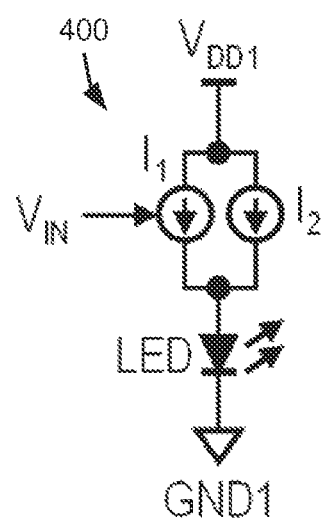
FIG. 4 is a circuit diagram depicting details of a driver circuit for a light source of an optocoupler in accordance with at least some embodiments of the present disclosure.

With reference now to FIG. 4, additional details of an illustrative driver circuit 400 for the input side will be described in accordance with at least some embodiments of the present disclosure. In particular, the driver circuit 400 may correspond to an example of driver circuitry 308. The circuit 400 is shown to receive the input side power supply VDD1 and the signal input VIN, where the signal input VIN corresponds to the logical signal to be communicated across the isolation barrier 324 and where the input side power supply VDD1 corresponds to the substantially constant voltage source used to drive the LED 312.

As shown in FIG. 4, there are two parallel branches in the driver circuit 400. A first branch connected between input side power supply VDD1 and the LED 312 provides a first current I1 and is controlled by the signal input VIN. A second branch connected between input side power supply VDD1 and the LED 312 provides a second current I2 and is not controlled by the signal input VIN. Thus, the first branch may be modulated or otherwise selectively provide the first current I1 and not provide the first current I1 under control of the signal input VIN. Conversely, the second branch is not modulated or controlled by the signal input VIN and the second current I2 is constantly driving the LED 312 as long as there is an input side power supply VDD1 available with certain voltage level. As an example, a certain voltage level is required to overcome the LED threshold in order for the I2 branch to conduct a desired level of current. In some embodiments, the second current I2 is less than the first current I1 when the signal input VIN is high and a full amount of the first current I1 is flowing through the first branch. As a non-limiting example, the first current I1, at full strength, may be at least ten times larger than the second current I2 at full strength. Further continuing the non-limiting example, the first current I1 may be configured to be modulated between approximately 0A and 5 mA while the second current may be configured to be substantially constant at about 0.5 mA. In some embodiments, the second current I2 may correspond to a substantially DC bias current to which the first current I1 is added when both currents I1, I2 are flowing through their respective branches. Thus, if the signal input VIN is low and no current is flowing through the first branch, then the LED 312 will be driven by approximately 0.5 mA whereas if the signal input VIN is high and the first current I1 is flowing through the first branch, then the LED 312 will be driven by approximately 5.5 mA. As can be appreciated, the first case (where the signal input VIN is low) will result in the photodetector 316 sensing a very small amount of light, but still enough to determine that the input side power supply VDD1 is available. The comparator circuit 320 will be able to determine that a logical low should be output at VOUT. In the second case (where the signal input VIN is high), a more intense light will be output by the LED 312 and the photodetector 316 will sense more light, thereby enabling the comparator circuit 320 to determine that a logical high should be output at VOUT. If both the first current I1 and the second current I2 are not being provided to the LED 312, then there will be substantially no light emitted across the isolation barrier 324 and the comparator circuit 320 will output a fault signal via FAULT.

Figure 5:
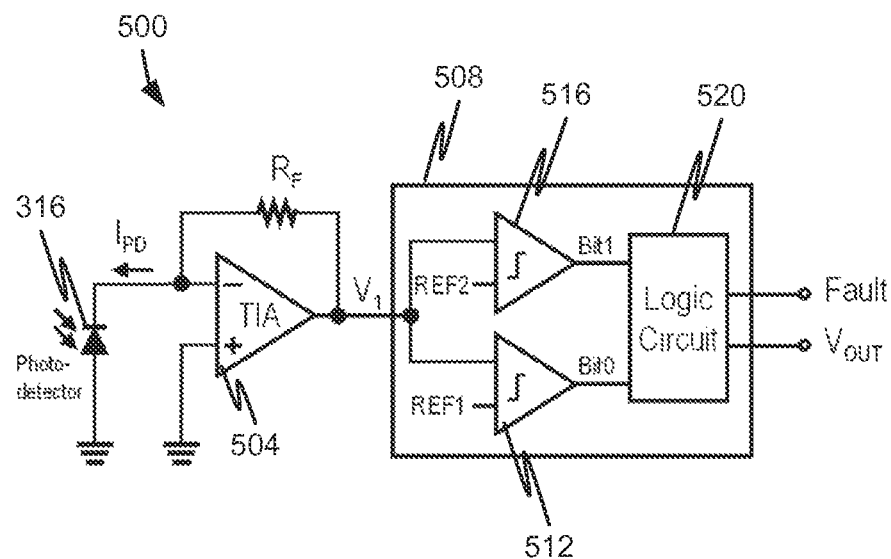
FIG. 5 is a circuit diagram depicting details of a receiver circuit of an optocoupler in accordance with at least some embodiments of the present disclosure.

With reference now to FIG. 5, additional details of an illustrative circuit 500 on the output side will be described in accordance with at least some embodiments of the present disclosure. The circuit 500 is shown to include the photodetector 316 and a number of additional circuit elements connected thereto. In some embodiments, the additional circuit elements shown in the circuit 500 may be considered part of the comparator circuit 320.

In the illustrative circuit 500, the photodetector 316 is connected to a transimpedance amplifier (TIA) 504, which amplifies the electrical signal output by the photodetector 316. The TIA 504 may also have a feedback network with at least a feedback resistor RF connected between its output and input. The output of the TIA 504 may be provided to a comparator module 508 that includes a first comparator 512, a second comparator 516, and a logic circuit 520 that ultimately outputs both the FAULT signal and the output signal VOUT. In some embodiments, the same output of the TIA 504 is provided to both the first comparator 512 and the second comparator 516. The first comparator 512 may be configured to compare the output of the TIA 504 to a first reference voltage REF1 while the second comparator 516 may be configured to compare the output of the TIA 504 to a second reference voltage REF2. In some embodiments, one of the reference voltages may correspond to an adequate reference voltage to determine if the second current I2 is being provided to the LED 312 while the other of the reference voltages may correspond to an adequate reference voltage to determine if the first current I1 is being provided to the LED 312.

For ease of discussion, assume that the first reference voltage REF1 corresponds to a reference voltage used to determine whether a fault condition exists for the input side (e.g., a reference voltage to detect if the LED 312 is receiving the second current I2 or DC bias current) and the second reference voltage REF2 corresponds to a reference voltage used to determine whether the signal input VIN is causing the first current I1 to be provided to the LED 312. Thus, in this example, the first comparator 512 is used to generate a logical output ('1' or '0') at Bit0 that is used to determine a fault condition whereas the second comparator 516 is used to generate a logical output at Bit1 that is used to determine the output signal VOUT. In this example, the first reference voltage REF1 would be less than the second reference voltage REF2, perhaps by an order of magnitude.

The output of the comparators 512, 516 is provided to the logic circuit 520 to determine the eventual outputs at the FAULT and VOUT. As an example, the logic circuit 520 may apply logic that if V1 (the output of the TIA 312) is less than the first reference voltage REF1, then a fault condition is determined and a fault signal is output at FAULT. If V1 is greater than or equal to the first reference voltage REF1 but less than the second reference voltage REF2, then a logical LOW may be output at the VOUT. If V2 is greater than the second reference voltage REF2, then a logical HIGH may be output at the VOUT.

Although the components of the comparator module 508 are shown to be separate from the TIA 504, it should be appreciated that some or all of the components of the comparator module 508 may be incorporated into the TIA 504 without departing from the scope of the present disclosure. As an example, both comparators 512, 516 and the logic circuit 520 may be incorporated into the TIA 504 without departing from the scope of the present disclosure.

Figure 6:
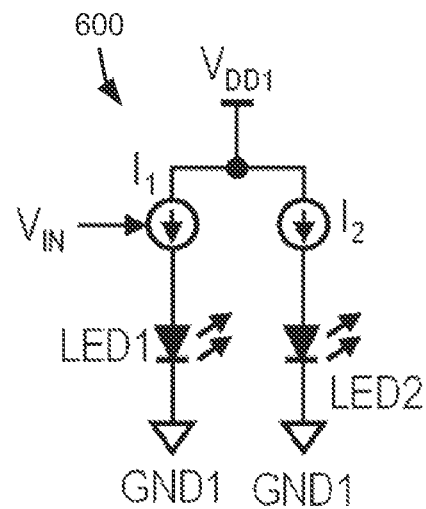
FIG. 6 is a circuit diagram depicting details of an alternative driver circuit for a plurality of light sources of an optocoupler in accordance with at least some embodiments of the present disclosure.

With reference now to FIG. 6, an alternative arrangement of a driver circuit 600 for the input side of the optocoupler 100 will be described in accordance with at least some embodiments of the present disclosure. The circuit 600 differs from circuit 400 in that two separate LEDs are used to transmit light across the isolation barrier 324. Specifically, a first light source LED 1 is connected to the first branch of the circuit 600 which receives the first current I1 (e.g., the modulated/controlled current) while a second light source LED2 is connected to the second branch of the circuit 600 which receives the second current I2 (e.g., the fault monitoring current). In this example, the second light source LED2 will be constantly ON whereas the first light source LED1 will be switching between ON and OFF states depending upon the signal input VIN. This configuration of a driver circuit 600 can be used in connection with the circuit 500 or any other output side circuit configuration described herein.

Figure 7:
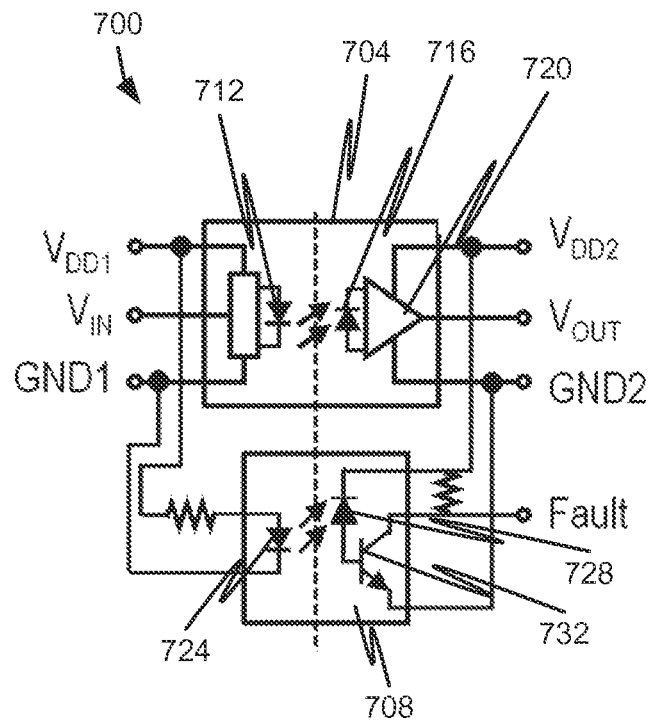
FIG. 7 is a circuit diagram depicting details of an alternative optocoupler circuit configuration in accordance with at least some embodiments of the present disclosure.
Figure 8:
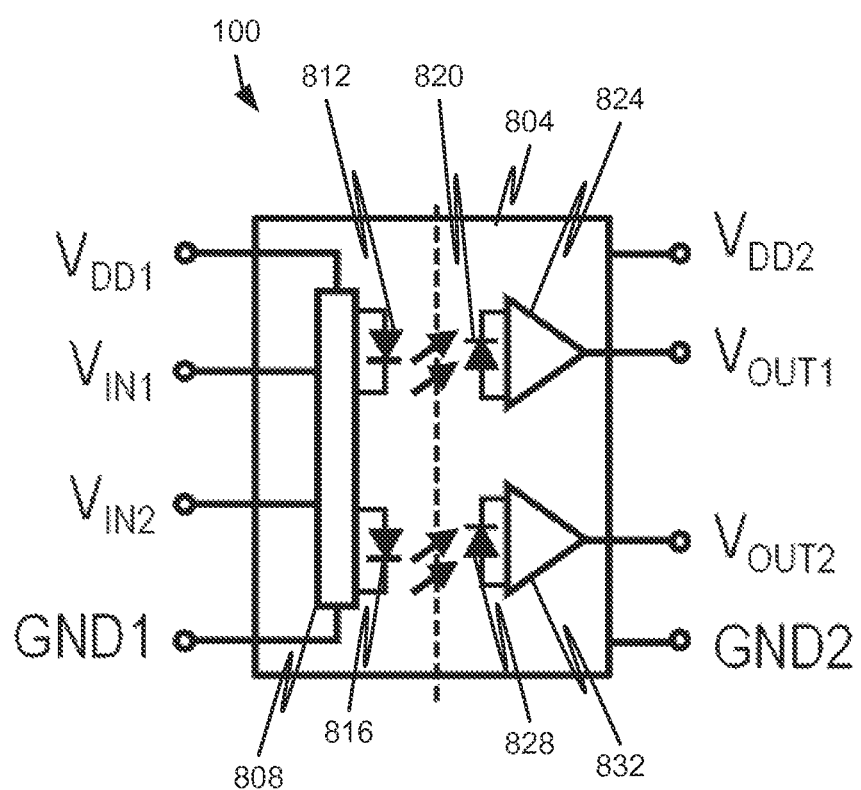
FIG. 8 is a circuit diagram depicting details of an alternative optocoupler circuit configuration in accordance with at least some embodiments of the present disclosure.

With reference now to FIGS. 7 and 8, additional alternative configurations of optocouplers or sets of optocouplers that can be used to carry out the power monitoring function described herein will be described in accordance with at least some embodiments of the present disclosure. With reference initially to FIG. 7, a pair of optocouplers 700 is shown having a first optocoupler 704 and a second optocoupler 708. The first optocoupler 704 may correspond to a conventional optocoupler that is without any fault monitoring components. Specifically, the first optocoupler 704 may have traditional driver circuitry that receives the input side power supply VDD1, the signal input VIN and appropriately controls the operation of the LED 712. The light emitted by the LED 712 may be detected with photodetector 716, which provides its output to comparator circuitry 720 to determine logical outputs for transmission via VOUT.

The second optocoupler 708 may be connected to the same input side power supply VDD1 as the first optocoupler 704 and the first ground GND1, but the LED 724 of the second optocoupler 708 may be solely driven by the input side power supply VDD1. As long as the input side power supply VDD1 is providing power to the LEDs 712, 724, the second LED 724 will emit light across the isolation barrier and be detected with a second photodetector 728 of the second optocoupler 708. The second photodetector 728 may provide its output to a simple switch or comparator 732 that produces the FAULT output based on whether light is detected at the photodetector 728 or not. Specifically, if enough light is detected at the second photodetector 728 to indicate that the input side power supply VDD1 is working, then the second optocoupler 708 may output the signal via FAULT indicating that no fault condition is present for the input side power supply VDD1. On the other hand, if the second photodetector 728 does not detect enough light, then the second optocoupler 708 may produce an output signal via FAULT indicating that a fault condition exists with respect to the input side power supply VDD1. Thus, the first comparator 704 may be used for determining logical signal levels whereas the second comparator 708 may be used for determining fault conditions.

Now with reference to FIG. 8, the configuration of an optocoupler 100 is shown where the optocoupler 100 comprises a pair of LEDs 812, 816 and a pair of photodetectors 820, 828 internal thereto. As compared to the pair of optocouplers in FIG. 7, the optocoupler 100 depicted in FIG. 8 uses a common driver circuit 808 to drive both the first LED 812 and the second LED 816. An example of the driver circuit 808 may be similar or identical to the driver circuit 600 shown in FIG. 6 where each LED 812, 816 receives different currents via different branches of the driver circuit 808.

At the output side, the first photodetector 820 may provide its output to first comparator circuitry 824 whereas the second photodetector 828 may provide its output to second comparator circuitry 832. All of the components of the optocoupler 100 may be included in a common housing 804. In some embodiments, the photodetectors 820, 828 may provide their outputs to a common comparator circuit, such as the comparator circuit 500 depicted in FIG. 5. However, the comparator circuit for the pair of photodetectors 820, 828 may comprise a pair of TIAs, which provide their outputs to different comparators in the comparator module. The outputs of the different comparators may then be provided to a common logic circuit as shown in FIG. 5.

In the example of FIG. 8, the first comparator circuitry 824 may be used to generate a first output, which can either represent whether a fault condition exists or not whereas the second comparator circuitry 832 may be used to generate a second output, which can represent the input signals VIN1 and/or VIN2.

Although various comparators, comparator components, input circuits, and output circuits have been depicted and described herein, it should be appreciated that an optocoupler can be designed to include any combination of circuits, circuit components, and/or circuit architectures depicted and/or described in connection with FIGS. 1-8. In other words, various aspects of different figures can be combined into a single optocoupler without departing from the scope of the present disclosure.

Figure 9:
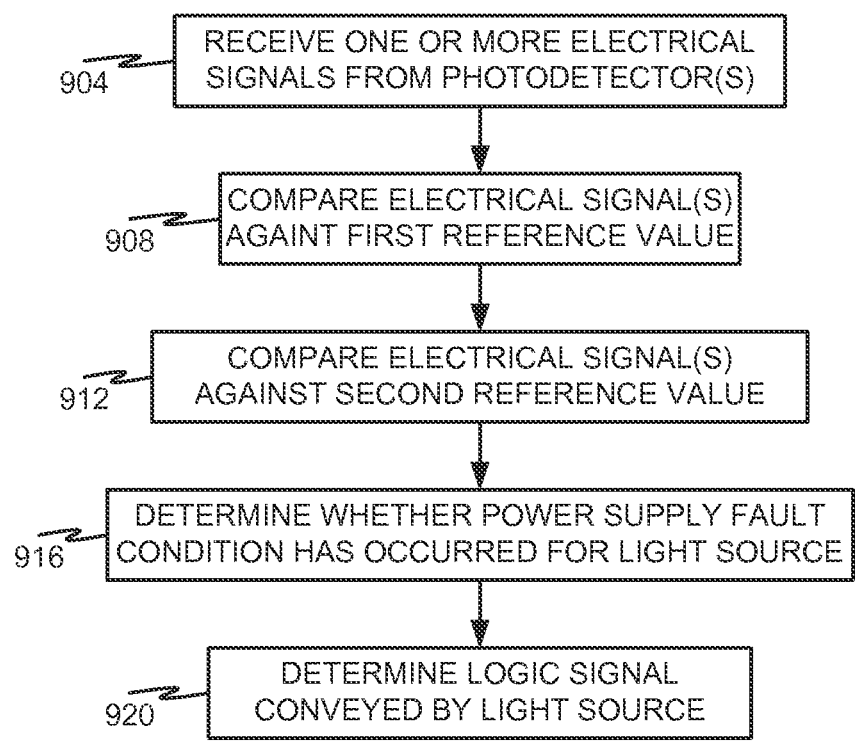
FIG. 9 is a flow diagram depicting a method of operating an optocoupler in accordance with at least some embodiments of the present disclosure.

With reference now to FIG. 9, an illustrative method of operating an optocoupler will be described in accordance with at least some embodiments of the present disclosure. The method begins when one or more electrical signals are received from photodetector(s) at an output side of an optocoupler (step 904).

The one or more electrical signals may be received at a TIA or as an output of one or more TIAs that are connected to outputs of the one or more photodetectors. The one or more electrical signals may be compared against at least a first reference value and a second reference value (steps 908 and 912). In some embodiments, the first and second reference values may correspond to threshold voltages such as reference voltages REF1, REF2 described herein above. In some embodiments, the first and second reference values may correspond to threshold currents as opposed to voltages. In fact, the reference values may correspond to any electrical property that is capable of representing the amount of light communicated across the isolation boundary of the optocoupler(s).

Based on the comparison of the one or more electrical signals with the first and second reference values, the method continues by determining whether a power supply fault condition has occurred for the light source that emitted the light which eventually resulted in the generation of the one or more electrical signals (step 916). The method also includes determining a logical signal that was conveyed by the light source (step 920). In some embodiments, the determination of step 920 may not be necessary or useful if a fault condition is determined in step 916. In some embodiments, the determinations at steps 916 and 920 may be performed substantially concurrently by a single comparator module.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. An optical system, comprising:
    at least one photodetector that receives light energy and converts the light energy into one or more electrical signals; and
    a comparator module that receives the one or more electrical signals from the at least one photodetector and compares the one or more electrical signals against two different reference values, wherein a comparison of the one or more electrical signals against a first of the two different reference values is used to determine whether a power supply fault condition has occurred for a light source that emitted the light energy, and wherein a comparison of the one or more electrical signals against a second of the two different reference values is used to determine a logic signal conveyed to the at least one photodetector via the light energy emitted by the light source.

2. The optical system of claim 1, wherein the logic signal corresponds to a first value when the one or more electrical signals is above the second of the two different reference values and wherein the logic signal corresponds to a second value when the one or more electrical signals is below the second of the two different reference values.

3. The optical system of claim 1, wherein the comparator module comprises a comparison circuit containing a first comparator and a second comparator, wherein the first comparator and second comparator both receive the one or more electrical signals, wherein the first comparator compares the one or more electrical signals with the first of the two different reference values, and wherein the second comparator compares the one or more electrical signals with the second of the two different reference values.

4. The optical system of claim 3, further comprising a transimpedance amplifier provided between the at least one photodetector and the comparator module, wherein the transimpedance amplifier amplifies the one or more electrical signals output by the at least one photodetector, and wherein the comparator module receives the one or more electrical signals after being amplified by the amplifier.

5. The optical system of claim 1, further comprising:
    a first light source that is electrically isolated from the at least one photodetector; and
    an isolation barrier that electrically isolates the first light source from the at least one photodetector.

6. The optical system of claim 1, further comprising a fault pin and an output voltage pin, wherein the fault pin provides an output indicating a fault condition when the one or more electrical signals do not exceed the first of the two different reference values, and wherein the output voltage pin provides the logic signal.

7. The optical system of claim 1, wherein the two different reference values correspond to voltage reference values.

8. An optical system, comprising:
    at least one photodetector that receives light energy and converts the light energy into one or more electrical signals; and
    a comparator module that receives the one or more electrical signals from the at least one photodetector and compares the one or more electrical signals against two different reference values, wherein a comparison of the one or more electrical signals against a first of the two different reference values is used to determine whether a power supply fault condition has occurred for a light source that emitted the light energy, and wherein a comparison of the one or more electrical signals against a second of the two different reference values is used to determine a logic signal conveyed to the at least one photodetector via the light energy emitted by the light source, wherein the first reference value is smaller than the second reference value and is used to determine whether the photodetector is receiving light energy indicative of the light source being driven with at least a fault monitoring current.

9. An optocoupler, comprising:
a light source configured to generate light energy and convey the light energy across an isolation barrier;
a photodetector that receives the light energy and converts the light energy into an electrical signal; and
a comparator module that receives the electrical signal and provides two outputs based on an analysis thereof, wherein the first output provided by the comparator module comprises a fault output that is indicative of a fault condition associated with a power supply of the light source, and wherein the second output provided by the comparator module comprises a logic signal output that corresponds to a logic signal communicated by the light source across the isolation barrier via the light energy.

10. The optocoupler of claim 9, wherein the comparator module comprises a pair of comparators and a logic circuit connected to the outputs of the pair of comparators.

11. The optocoupler of claim 9, wherein the comparator module detects the fault condition by comparing the electrical signal with a first reference value and determining whether the electrical signal is greater than or less than the first reference value.

12. The optocoupler of claim 11, wherein the comparator module detects the logic signal by comparing the electrical signal with a second reference value and determining whether the electrical signal is greater than or less than the second reference value.

13. The optocoupler of claim 12, wherein the first reference value and second reference value corresponds to voltage reference values.

14. The optocoupler of claim 9, wherein the light source receives a first driver current controlled by an input signal and wherein the light source also receives a second driver current that corresponds to a fault monitoring current.

15. The optocoupler of claim 14, wherein the second driver current is substantially continuously provided to the light source unless there is a failure in a driver power supply for the light source.

16. The optocoupler of claim 15, wherein the first driver current is intermittently provided to the light source depending upon a desired signal that is to be transmitted across the isolation barrier.

17. An isolation device, comprising:
at least one light source configured to generate light energy and convey the light energy across an isolation barrier;
at least one photodetector that receives light energy and converts the light energy into one or more electrical signals; and
a comparator module that receives the one or more electrical signals from the at least one photodetector and compares the one or more electrical signals against a first reference value and a second reference value, wherein a comparison of the one or more electrical signals against the first reference value is used to determine whether a power supply fault condition has occurred for the at least one light source, and wherein a comparison of the one or more electrical signals against the second reference value is used to determine a logic signal conveyed to the at least one photodetector via the light energy emitted by the at least one light source.

18. The isolation device of claim 17, wherein the at least one light source comprises a first light source and a second light source, wherein the first light source receives a first driver current and intermittently transmits an optical logic signal across the isolation barrier in accordance with the first driver current, and wherein the second light source receives a second driver current and substantially continuously transmits an optical signal across the isolation barrier as long as the second driver current is being received by the second light source.

19. The isolation device of claim 17, wherein the at least one photodetector comprises a first photodetector and a second photodetector, wherein the first photodetector is used to sense the logic signal, and wherein the second photodetector is used to detector the power supply fault condition.

20. The isolation device of claim 17, wherein the comparator module comprises a comparison circuit containing a first comparator and a second comparator, wherein the first comparator and second comparator receive both receive the one or more electrical signals, wherein the first comparator compares the one or more electrical signals with the first reference value, and wherein the second comparator compares the one or more electrical signals with the second reference value.

* * * * *